US006646916B2

(12) United States Patent
Kamei

(10) Patent No.: US 6,646,916 B2
(45) Date of Patent: *Nov. 11, 2003

(54) NON-VOLATILE SEMICONDUCTOR MEMORY DEVICE

(75) Inventor: Teruhiko Kamei, Yokohama (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/115,913

(22) Filed: Apr. 5, 2002

(65) Prior Publication Data

US 2003/0021167 A1 Jan. 30, 2003

(30) Foreign Application Priority Data

Apr. 13, 2001 (JP) ........................................ 2001-115677

(51) Int. Cl.[7] .............................................. G11C 16/04
(52) U.S. Cl. .............................. 365/185.11; 365/185.14; 365/185.16
(58) Field of Search ...................... 365/185.11, 185.14, 365/185.26, 185.16

(56) References Cited

U.S. PATENT DOCUMENTS

| | | | | |
|---|---|---|---|---|
| 5,408,115 | A | | 4/1995 | Chang ......................... 257/324 |
| 5,412,600 | A | * | 5/1995 | Nakajima ................ 365/185.17 |
| 5,422,504 | A | | 6/1995 | Chang et al. ................. 257/316 |
| 5,494,838 | A | | 2/1996 | Chang et al. ................... 437/43 |
| 5,663,923 | A | | 9/1997 | Baltar et al. ............ 365/230.03 |
| 5,969,383 | A | | 10/1999 | Chang et al. ................. 257/316 |
| 6,151,248 | A | * | 11/2000 | Harari et al. ........... 365/185.14 |
| 6,177,318 | B1 | | 1/2001 | Ogura et al. ................. 438/267 |
| 6,248,633 | B1 | | 6/2001 | Ogura et al. ................. 438/267 |
| 6,255,166 | B1 | | 7/2001 | Ogura et al. ................. 438/257 |

FOREIGN PATENT DOCUMENTS

| | | |
|---|---|---|
| JP | A 63-225991 | 9/1988 |
| JP | A 1-300496 | 12/1989 |
| JP | A 7-161851 | 6/1995 |
| JP | B1 2978477 | 9/1999 |
| JP | A 2001-156188 | 6/2001 |

OTHER PUBLICATIONS

U.S. patent application Ser. No. 10/115,956, Kamei, filed Apr. 15, 2002, (Atty Dckt: 112500).
U.S. patent application Ser. No. 09/955,158, Kanai et al., filed Sep. 19, 2001, (Atty Dckt: 110656).
U.S. patent application Ser. No. 09/955,160, Kanai et al., filed Sep. 19, 2001, (Atty Dckt: 110655).
Hayashi et al., "Twin MONOS Cell with Dual Control Gates", 2000 Symposium on VLSI Technology Digest of Technical Papers.
Chang et al., "A New SONOS Memory Using Source–Side Injection for Programming", IEEE Electron Device Letters, vol. 19, No. 7, 1998.
Chen et al., "A Novel Flash Memory Device with S Plit Gate Source Side Injection and ONO Charge Storage Stack (SPIN)", 1997 Symposium on VLSI Technology Digest Technical Papers.

* cited by examiner

*Primary Examiner*—Richard Elms
*Assistant Examiner*—Jung H. Hur
(74) *Attorney, Agent, or Firm*—Oliff & Berridge, PLC

(57) ABSTRACT

A non-volatile semiconductor memory device has a memory cell array region in which a plurality of memory cells are disposed in both a column direction and a row direction, each of the memory cells having first and second MONOS memory cells that are controlled by a word gate and first and second control gates. The memory cell array region is divided in the row direction into a plurality of sector regions 0 extending longitudinally in the column direction. Each of the sector regions has a plurality of memory cells disposed in each of columns arrayed in the column direction. A control gate drive section has a plurality of control gate drivers for each of the sector regions. Each of the control gate drivers sets a potential for the first and second control gates within the corresponding sector region, independently of the other sector regions.

14 Claims, 13 Drawing Sheets

NON-VOLATILE SEMICONDUCTOR MEMORY DEVICE

Japanese Patent Application No. 2001-115677, filed on Apr. 13, 2001, is hereby incorporated by reference in its entirety.

BACKGROUND OF THE INVENTION

The present invention relates to a non-volatile semiconductor memory device configured of memory cells each of which is provided with two non-volatile memory elements that are controlled by one word gate and two control gates.

A known type of non-volatile semiconductor device is a metal-oxide-nitride-oxide semiconductor or substrate (MONOS) wherein a gate insulation layer between the channel and the gate is formed of a multi-layer stack of a silicon oxide film, a silicon nitride film, and a silicon oxide film, and charge is trapped in the silicon nitride film.

This MONOS type of non-volatile semiconductor memory device was disclosed by Y. Hayashi, et al, in 2000 Symposium on VLSI Technology Digest of Technical Papers, pp. 122-123. This document disclosed a MONOS flash memory cell provided with two non-volatile memory elements (MONOS memory cells) controlled by one word gate and two control gates. In other words, each flash memory cell has two charge-trapping sites.

A plurality of MONOS flash memory cells of this configuration are arranged in both a row direction and a column direction, to form a memory cell array region.

Two bit lines, one word line, and two control gate lines are required for driving this MONOS flash memory cell. It should be noted, however, that these lines can be connected in common if different control gates are set to the same potential during the driving of a large number of memory cells.

In this case, a flash memory operation is data erasure, programming, or reading. Data programming and reading is usually done for selected cells for eight or 16 bits simultaneously, but data erasure is simultaneously done over a much wider range.

In such a case, data disturbance becomes a cause of concern with this type of non-volatile memory. Data disturbance refers to the disturbance of data in non-selected cells, during programming or erasure done by repeating a programming or erasure state in which a high potential is applied even to cells within the non-selected sector region by the common wiring, during programming or erasure in which a high potential is applied to the control gate line and bit line of the selected cells.

To prevent such a situation, the configuration could be such that a select gate circuit is provided to ensure that the high potential is applied only to cells in the selected sector, whereas no high potential is applied to cells in non-selected sector.

With such a configuration, however, the select gate circuit takes up some surface area, preventing a high degree of integration of the memory cells. In addition, if a voltage drop occurs in the select gates, it is necessary to supply an increased voltage to allow for that voltage drop, in order to supply a high potential to cells in selected sectors during programming or erasure. As a result, low-voltage drive is impeded, making this unsuitable for equipment that demands a low power consumption, such as portable equipment in particular.

BRIEF SUMMARY OF THE INVENTION

The present invention may provide a non-volatile semiconductor memory device that enables a high degree of integration without requiring a selection gate circuit, while preventing any disturbance of data in cells in non-selected sectors during the programming or erasure of selected cells.

The present invention may also provide a non-volatile semiconductor device that prevents any voltage drop by making a selection gate circuit unnecessary, thus reducing the power consumption thereof.

According to one aspect of the present invention, there is provided a non-volatile semiconductor memory device has a memory cell array region in which are disposed a plurality of memory cells in both a column direction arid a row direction, each of the memory cells having first and second non-volatile memory elements that are controlled by one word gate and first and second control gates. The non-volatile semiconductor memory device further provided with a control gate drive section which drives the first and second control gates of the memory cells within the memory cell array region.

The memory cell array region is divided in the row direction into a plurality of sector regions. Each of the sector regions has a plurality of memory cells disposed in each of columns arrayed in the column direction.

The control gate drive section has a plurality of control gate drivers each of which corresponds to one of the sector regions. Each of the control gate drivers is capable of setting a potential for the first and second control gates within the corresponding sector region, independently of other sector regions.

During the programming of selected cells within one sector region, this configuration makes it possible to ensure that the corresponding control gate driver applies the programming or erasure potential only to the control gates of the memory cells (selected cells and non-selected cells) within that sector region. Since other sector regions can be set to have a potential other than the programming or erasure potential by the corresponding control gate drivers, there is no disturbance of data in the cells within the non-selected sector regions. This also makes it possible to provide a high degree of integration of the memory cells, because this effect can be achieved without the use of a select gate circuit. Since there is also no voltage drop due to the select gate circuit, low-voltage drive is enabled, which is particularly advantageous for memory used in portable equipment.

When data is erased, one of the control gate drivers may be selected and supply a first high potential for erasure to all of the first and second control gates within the corresponding sector region, to erase data in a batch in each of the plurality of sector regions.

A plurality of control gate lines may be formed to extend in the column direction in each of the sector regions, and the control gate drive section may be connected directly to the control gate lines disposed in each of the sector regions, with no intervening gate circuit.

This ensures that no high potential is applied to non-selected cells within non-selected sector regions, even when the gate circuit that would increase the surface are a and generate a voltage drop has been removed.

In this case, the control gate lines may include: a plurality of main control gate lines connected directly to the control gate drive section; and a plurality of sub-control gate lines that connect the main control gate lines to the first and second control gates of the memory cells. These lines can be formed by metal wiring in different layers.

In this case, an even-numbered main control gate line in each of the sector regions may be connected to one of the sub-control gate lines to which the second control gates of the memory cells in an even-numbered column and the first control gates of the memory cells in an odd-numbered column are commonly connected. Similarly, an odd-numbered main control gate line in each of the sector regions may be connected to another one of the sub-control gate lines to which the second control gates of the memory cells in the odd-numbered column and the first control gates of the memory cells in the even-numbered column are commonly connected.

Moreover, if k main control gate lines are connected to each of the control gate drivers each of which corresponds to one of the sector regions, the memory blocks corresponding to I/O lines formed by a group of the memory cells connected to k sub-control gate lines are arranged in the row direction in each of the sector regions. In this case, a plurality of wires may be provided extending in the row direction. Each of the wires could connect one of the k main control gate lines to the corresponding one of the k sub-control gate lines.

The number of the memory-cells arranged in the row direction in each of the memory blocks could be 4. In such a case, k is set to 4 and four main control gate lines are connected to the control gate driver. Since there are four cells in the row direction of the memory blocks, there is a total of 8 bits. Four sub-control gate lines can be arranged by commonly using one sub-control gate line for 2 bits.

Each of the sector regions may further include a plurality of bits lines extending in the column direction, and a first bit line drive section which drives the bit lines at least during the programming and reading of data.

The first bit line drive section could be set to drive a plurality of the bit lines during data erasure, but it is also possible to further provide a second bit line drive section for erasure. This second bit line drive section for erasure operates during data erasure for each one sector region, to supply a second high potential for erasure to the bit lines in that one sector region.

Each of the sector regions may be formed in a well region separated from the other sector regions, and a well drive section for erasure which supplies a second high potential for erasure to the well region may be provided.

In addition, the bit lines maybe formed of impurity layers, and the bit lines could be respectively connected to a plurality of main bit lines. Forming the main bit lines of metal wiring makes it possible to reduce the resistance of the bit lines, and even if that impurity layers are discontinuous in the column direction, it is possible to charge each of those discontinuous bit lines through the main bit lines.

In this case, no intervening gate circuit may be provided in the paths from the main bit lines to the corresponding bit lines. This is because the gate circuit would increase the wiring capacitance of the bit lines, causing a voltage drop in the gate circuit and preventing the implementation of low-voltage drive.

The memory cell array region may include a plurality of word lines extending in the row direction, and each of the word lines may be commonly connected to the word gates of the memory cells arranged in a row. In such a case, the word lines can be used in common in the sector regions. A word line drive section which drives the word lines may be provided at one end of the memory cell array region in the row direction. To further increase the storage capacity of the non-volatile semiconductor memory device, a plurality of memory cell array regions could be disposed on either side of the word line driver in the row direction.

Each of the first and second non-volatile memory elements may have an ONO film formed of an oxide film (O), a nitride film (N), and an oxide film (O) as a charge-trapping site, but the configuration is not limited thereto and other structures are possible.

DETAILED DESCRIPTION OF THE EMBODIMENT

Figure 1:
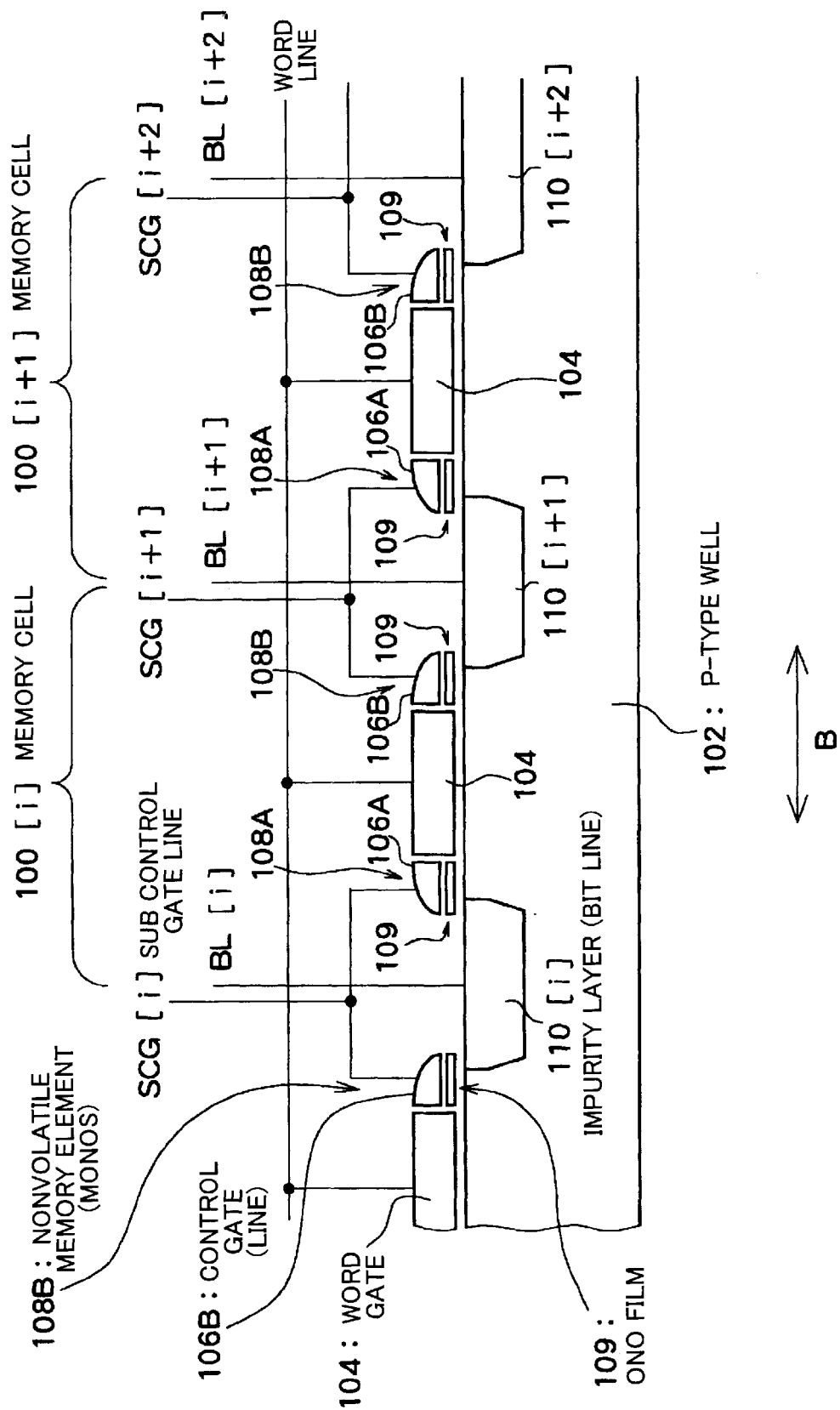
FIG. 1 is a sectional view taken through memory cells used in a non-volatile semiconductor memory device in accordance with one embodiment of the present invention.

An embodiment of the present invention is described below with reference to the accompanying figures.
Memory Cell Configuration A section through a non-volatile semiconductor memory device is shown in FIG. 1 with an equivalent circuit diagram thereof being shown in FIG. 2. In FIG. 1, one memory cell 100 has a word gate 104, first and second control gates 106A and 106B, and first and second memory elements (MONOS memory cells) 108A and 108B, formed of a material such as a polycide over a gate oxide film on a p-type well 102.

The first and second control gates 106A and 106B are formed on two side walls of the word gate 104 and are each electrically insulated from the word gate 104.

Each of the first and second memory elements 108A and 108B is formed of a stack of an oxide film (O), a nitride film (N), and an oxide film (O), between one of the first and second control gates 106A and 106B, which is formed of polysilicon corresponding to the metal (M) of MONOS, and the p-type well 102. Note that the first and second control gates 106A and 106B could be formed of a conductive material such as a silicide.

Thus the memory cell 100 has the first and second MONOS memory cells 108A and 108B provided with a split gate (the first and second control gates 106A and 106B), and there is one word gate 104 in common for the first and second MONOS memory cells 108A and 108B.

These first and second MONOS memory cells 108A and 108B each function as a charge-trapping site. Each of the first and second MONOS memory cells 108A and 108B can trap a charge in an ONO film 109.

Figure 2:
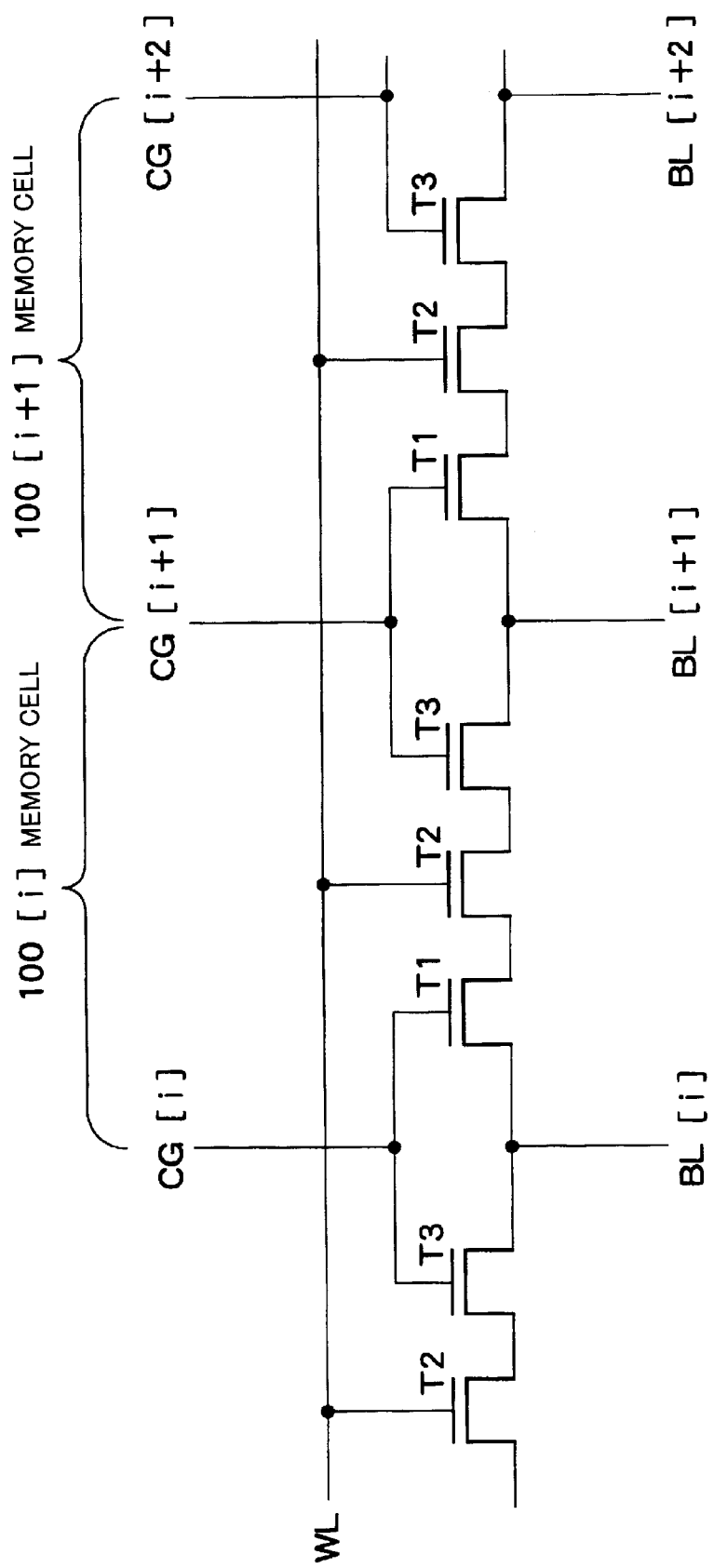
FIG. 2 is an equivalent circuit diagram of the memory cells shown in FIG. 1.

As shown in FIGS. 1 and 2, a plurality of the word gates 104 that are disposed at a predetermined spacing in a row direction (a second direction B in FIGS. 1 and 2) are connected in common to one word line WL formed of a material such as a polycide.

The control gates 106A and 106B shown in FIG. 1 extend along a column direction (a first direction A, perpendicular to the paper in FIG. 1) and are used in common by a plurality of the memory cells 100 disposed in the column direction. Thus reference numbers 106A and 106B also denote control gate lines.

In this case, the control gate line 106B of the [i] th memory cell 100[i] and the control gate line 106A of the [i+1] th memory cell 100[i+1] are connected to a sub-control gate line SCG[i+1] that is formed of a metal first layer above the word gates, control gates, and word lines, by way of example.

An [i+1] th impurity layer 110[i+1] is provided in common within the p-type well 102 for the MONOS memory cell 108B of the [i] th memory cell 100[i] and the MONOS memory cell 108A of the [i+1] th memory cell 100[i+1].

These impurity layers 110[i], 110[i+1], and 110[i+2] are n-type impurity layers formed within the p-type well to extend in the column direction (the first direction A perpendicular to the paper in FIG. 1), by way of example, which function as bit lines common to the plurality of memory cells 100 disposed in the column direction. Thus reference numbers 110[i], 110[i+1], and 110[i+2] also denote bit lines BL[i], BL[i+1], and BL[i+2]

Memory Cell Data Read

As shown in FIG. 2, one memory cell 100 can be represented schematically by a transistor T2 driven by the word gate 104 and transistors T1 and T3 driven by the first and second control gates 106A and 106B, respectively, these three transistors being connected in series.

Figure 3:
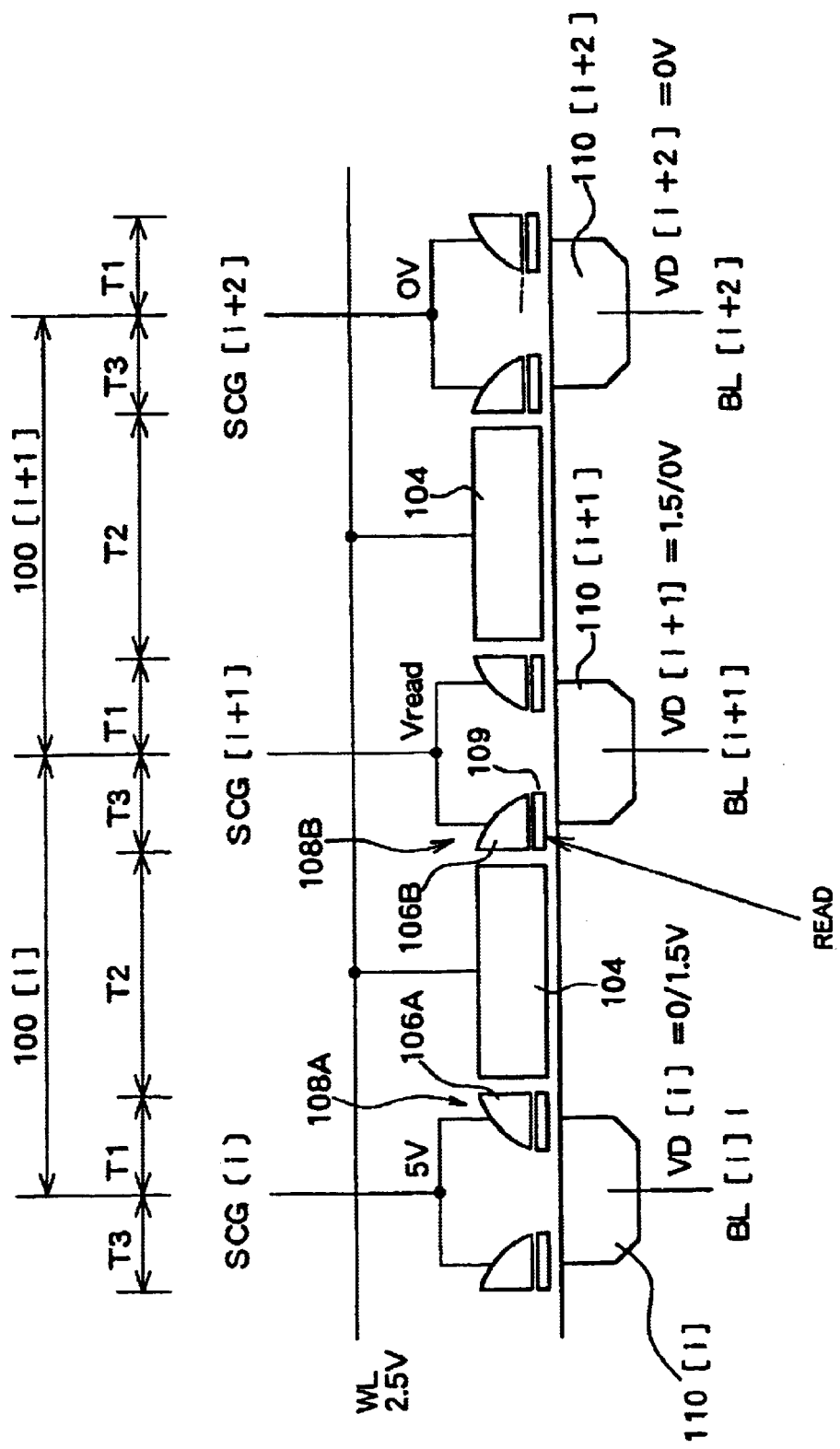
FIG. 3 is a schematic view that is illustrative of the operation of reading data from the non-volatile semiconductor memory device of FIG. 1.

In the description of the operation of the memory cells 100, the discussion first concerns the setting of the various potentials of two adjacent memory cells 100[i] and 100[i+1]. FIG. 3 illustrates the reading of data from the MONOS memory cell 108B on the right side of the word gate 104 of the memory cell 100[i]. Note that the threshold voltages of the transistors T1 to T3 are assumed to be less than 2.5 V in the discussion below.

In this case, a voltage such as 2.5 V is applied to the memory cell 100[i] and the word gate 104 that is in the same row, turning on each transistor T2. An over-ride voltage (such as 5 V) is applied through the sub-control gate line SCG[i] to the control gate 106A on the left side of the memory cell 100[i], turning on the transistor T1 corresponding to the MONOS memory cell 108A. A read potential Vread is applied as a potential VCG of the control gate 106B on the right side of the memory cell 100[i].

During this time, the operation of the transistor T3 corresponding to the MONOS memory cell 108B on the right side of the word gate 104 depends on whether or not a charge has accumulated in the MONOS memory cell 108B, as described below.

Figure 4:
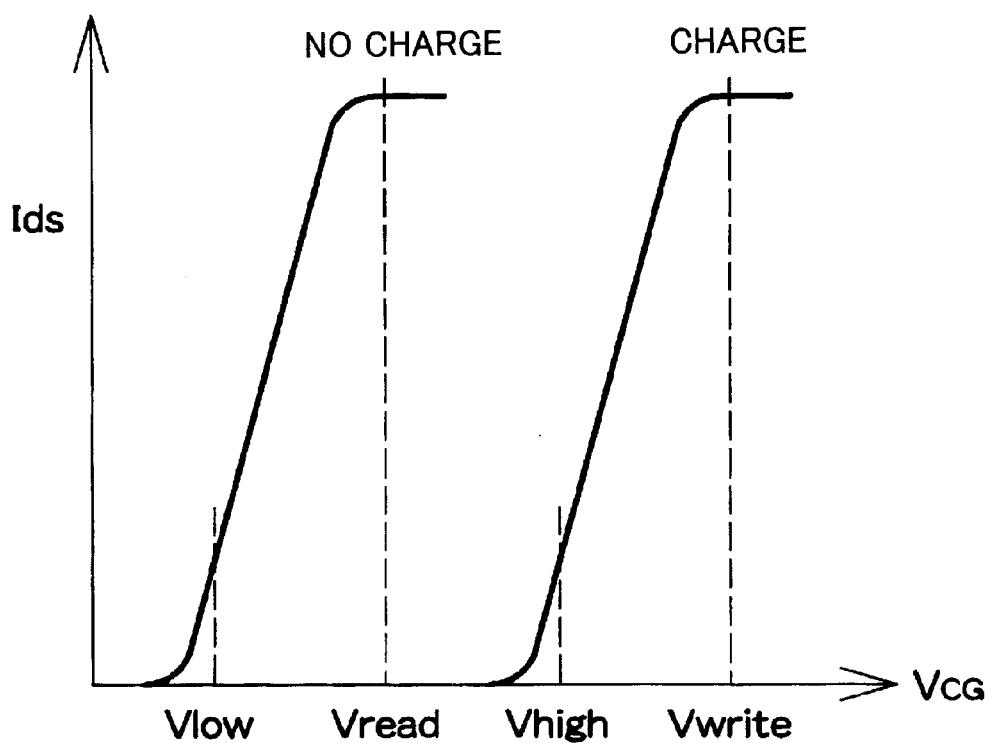
FIG. 4 is a characteristic chart showing the relationship between the control gate voltage VCG and the source-drain current Ids in the memory cells of FIG. 1.

The relationship between the voltage applied to the control gate 106B on the right side of the memory cell 100[i] and the current Ids flowing between the source and drain of the transistor T3 corresponding to the MONOS memory cell 108B that is controlled thereby is shown in FIG. 4.

As shown in FIG. 4, if there is no charge accumulated in the MONOS memory cell 108B, the current Ids starts to flow when the control gate potential VCG exceeds a low threshold voltage Vlow. If there is a charge in the MONOS memory cell 108B, on the other hand, the current Ids does not start to flow until the control gate potential VCG has exceeded a high threshold voltage Vhigh.

In this case, the voltage Vread applied to the control gate 106B during a data read is set to a voltage (such as 2.5 V) that is substantially intermediate between the two threshold voltages Vlow and Vhigh.

This ensures that the current Ids flows if there is no charge accumulated in the MONOS memory cell 108B but the current Ids does not flow if there is a charge in the MONOS memory cell 108B.

In this case, the potential VD[i] of the bit line BL[i] (impurity layer 110[i]) has been set to 0 V for data read and the potential VD[i+1] of the bit line BL[i+1] (impurity layer 110[i+1]) has been set to 1.5 V. This ensures that the potential VD[i] changes from 0 V to 1.5 V and the potential VD[i+1] changes from 1.5 V to 0 V, because the current Ids flows when there is no charge in the MONOS memory cell 108B, through the transistors T1 and T2 which are on. If there is a charge in the MONOS memory cell 108B, on the other hand, the current Ids does not flow and thus the potential VD[i] remains at 0 V and the potential VD[i+1] remains at 1.5 V, even though the transistors T1 and T2 are on. It is therefore possible to read data from the MONOS memory cell 108B of the memory cell 100[i] by detecting the potentials of the pair of bit lines BL[i] and BL[i+1].

Note that even if the transistors T1 and T2 of the memory cell 100[i+1] are on, the control gate potential VCG of that transistor T3 is 0 V and the potential VCG is lower than both of the two threshold voltages Vlow and Vhigh of FIG. 3, ensuring that the source-drain current does not flow in the memory cell 100[i+1]. This ensures that there is no adverse effect on the data read from the memory cell 100[i], *even if there is a charge in the memory cell* 100[i+1].

The various potentials in the memory cells 100[i] and 100[i+1] could be set in a similar fashion to that described above for the reading of data form the MONOS memory cell 108A on the left side of the memory cell 100[i].

Memory Cell Programming

Figure 5:
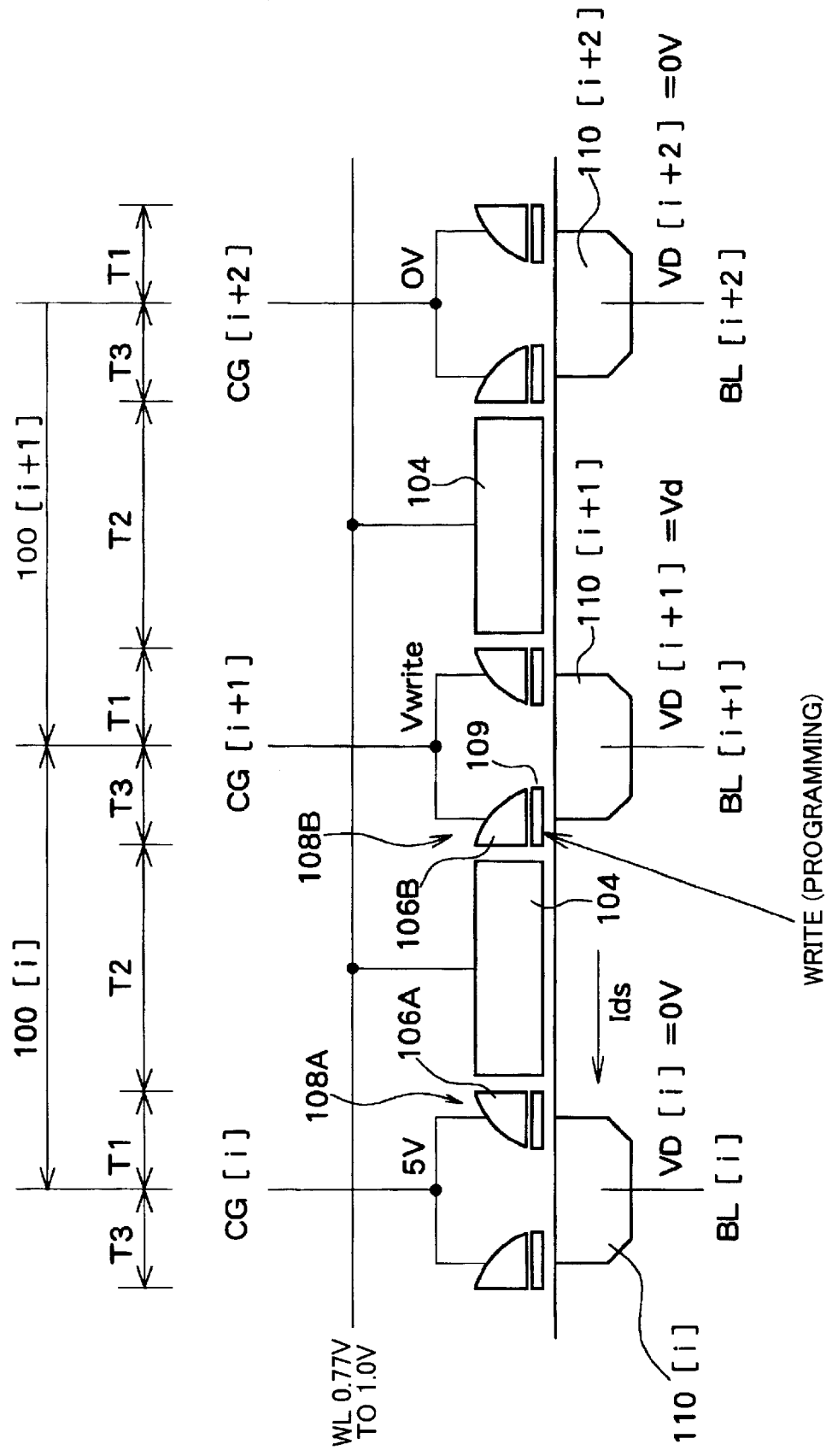
FIG. 5 is a schematic view that is illustrative of the operation of writing data (programming) into the non-volatile semiconductor memory device of FIG. 1.

The description now turns to the programming of data into the MONOS memory cell 108B on the right side of the word gate 104 of the memory cell 100[i], with reference to FIG. 5. Note that the data erasure operation that will be described later must be performed before this data programming.

In FIG. 5, it is assumed that the potential of the sub-control gate line SCG[i] is at the over-ride potential (for example, 5 V) and the potential of the sub-control gate line SCG[i+2] is 0 V, in the same way as in FIG. 3. However, the potential of each word gate 104 is set to a value on the order of 0.77 to 1.0 V, by way of example, by the word line WL. The potential of the control gate 108B on the right side of the memory cell 100[i+1] is set to the write potential Vwrite (such as 5 to 6 V) shown in FIG. 4 through the sub-control gate line SCG[i+1], and the potential VD[i+1] of the [i+1] th impurity layer 110[i+1] (the bit line BL[i+1]) is set to 4.5 to 5 V, by way of example.

Under those circumstances, each of the transistors T1 and T2 of the memory cell 100[i] is turned on, the current Ids flows towards the impurity layer 110[$i$], and channel hot electrons (CHE) are trapped in the ONO film 109 of the MONOS memory cell 108B. Thus the MONOS memory cell 108B is programmed and either 0 or 1 is written as data thereto.

Memory Cell Data Erasure

Figure 6:
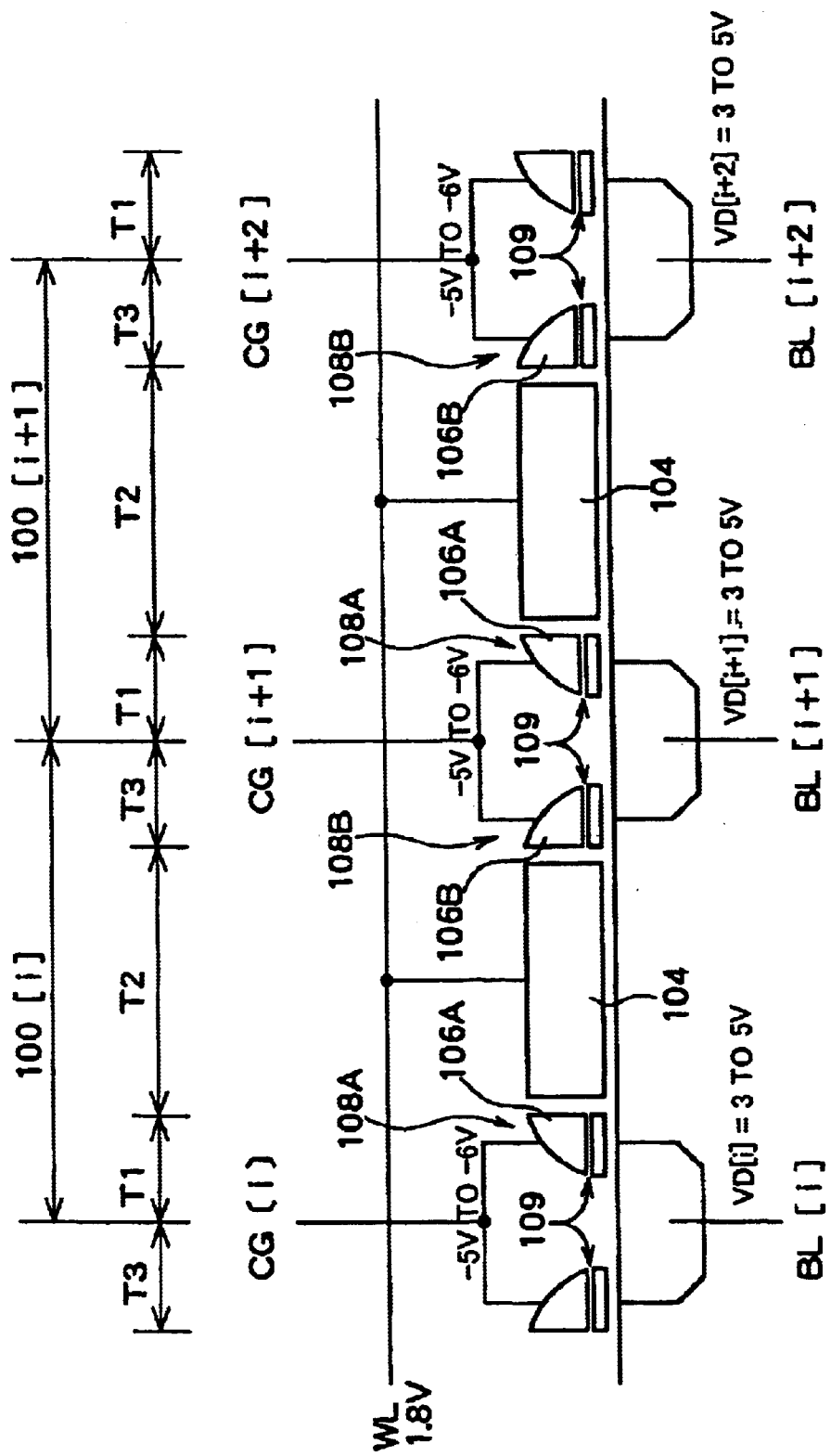
FIG. 6 is a schematic view that is illustrative of the operation of erasing data from the non-volatile semiconductor memory device of FIG. 1.

The description now turns to the erasure of data from the two memory cells 100[$i$] and 100[$i$+1] connected to the word line WL, with reference to FIG. 6.

In FIG. 6, the potential of the word gate 104 is set by the word line WL to 1.8 V, by way of example, and the potentials of the control gates 106A and 106B are set on the order of −5 to −6 V (first high potential for erasure). In addition, the potentials of each of the impurity layers (bit lines) 110[$i$], 110[$i$+1], and 110[$i$+2] are set to be equal to the p-type well potential at 3 to 5 V (second high potential for erasure).

Under those circumstances, electrons trapped in the ONO film 109 of each of the MONOS memory cells 108A and 108B escape due to the electrical field formed by the first high potential for erasure applied to the metal (M) and the second high potential for erasure applied to the silicon (S), erasing the data. This makes it possible to erase data from a plurality of memory cells simultaneously. Note that an operation that differs from that described above could be used for erasure, wherein hot holes are created by band—band tunneling in the surface of the impurity layer that forms the bit lines so that accumulated electrons are erased.

Overall Configuration of Non-Volatile Semiconductor Memory Device

Figure 7A:
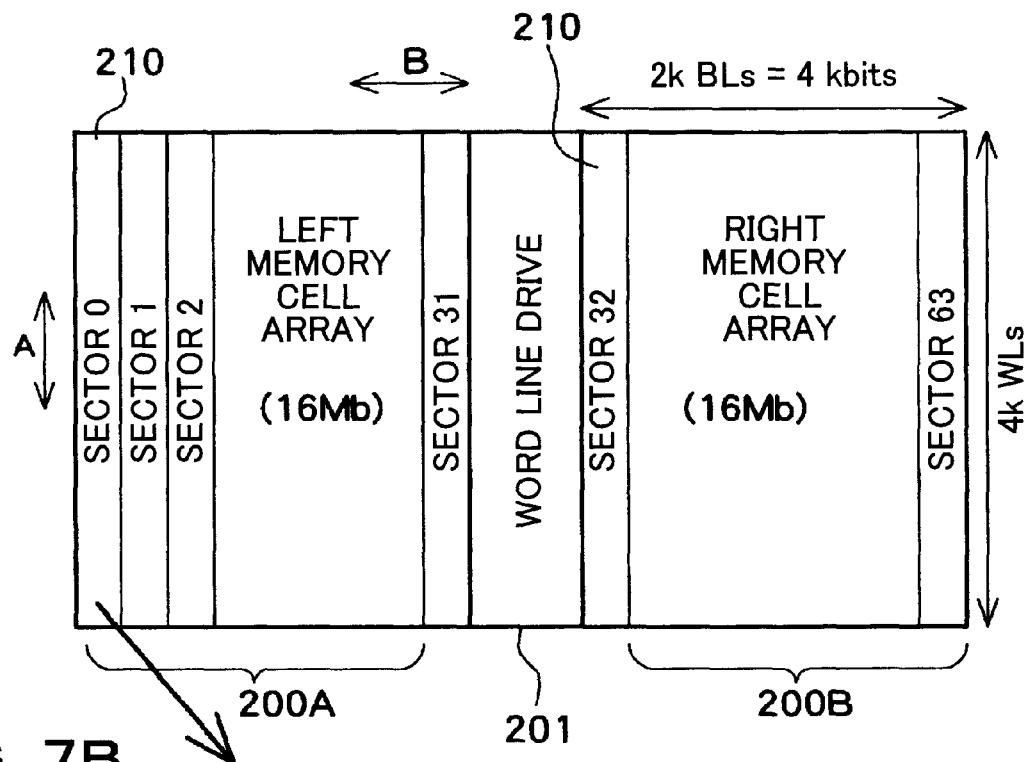
FIG. 7A is a plan view of the layout of the entire non-volatile semiconductor memory device of FIG. 1.
Figure 7B:
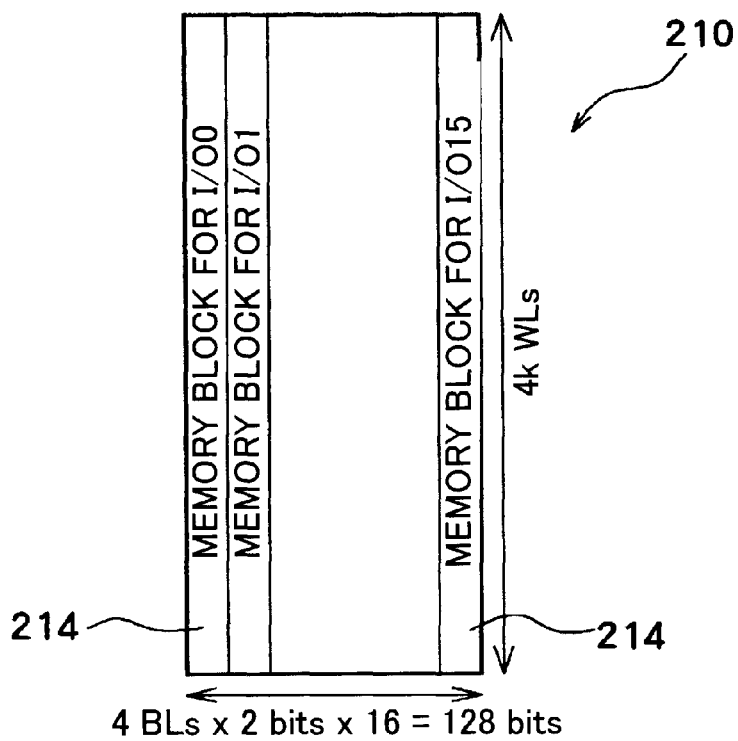
FIG. 7B is a plan view of one sector region shown in FIG. 7A.

The description now turns to the overall configuration of the non-volatile semiconductor memory device formed by using the above-described memory cell 100, with reference to FIGS. 7A and 7B.

FIG. 7A shows the plan layout of a one-chip non-volatile semiconductor memory device, where left and right memory cell array regions 200A and 200B on either side of a word line drive section 201 are each divided into 32 sector regions 210, by way of example. The one-chip non-volatile semiconductor memory device thus has 0th to 63rd sector regions 210.

Since the left and right memory cell array regions 200A and 200B are each divided in the second direction (row direction) B, as shown in FIG. 7A, each of the 32 sector regions 210 has a longitudinal rectangular shape taking the first direction (column direction) A as the longitudinal direction thereof. The minimum unit for data erasure is one sector region 210 and data stored within that sector region 210 is batch-erased.

Each of the left and right memory array regions 200A and 200B has 4 k word lines WL and 2 k bit lines BL, by way of example. In this case, two MONOS memory cells 108A and 108B are connected to each bit line BL in this embodiment, so that 2 k bit lines BL means a storage capacity of 4 kbits. Since the non-volatile semiconductor memory device of FIG. 7A has the left and right memory array regions 200A and 200B, the total storage capacity thereof is defined as: (4 k word lines WL)×(2 k bit lines BL)×2×2. The storage capacity of each sector region 210 is 1/64 of the total storage capacity of the memory, and is defined as: (4 k word lines WL)×(64 bit lines BL)×2×2.

FIG. 7B shows details of one sector region 210 of the non-volatile semiconductor memory device of FIG. 7A. As shown in FIG. 7B, each sector region 210 is divided in a second direction into memory blocks for I/O0 to I/O15 (memory blocks corresponding to input/output bits), enabling the reading and writing of 16-bit data.

Each memory block 214 has 4 k (4096) word lines WL, as shown in FIG. 7B.

Sector Region Details

Figure 8:
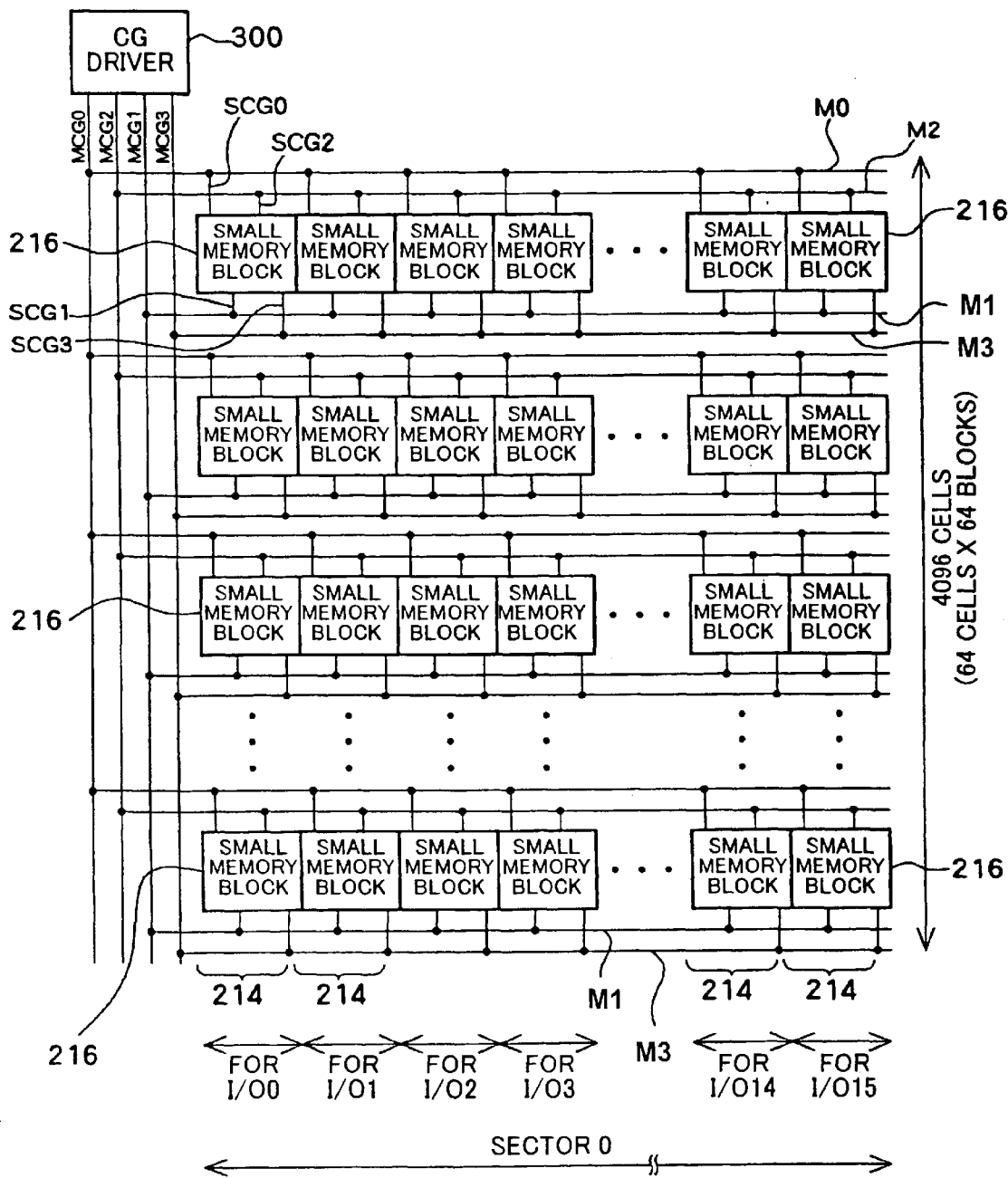
FIG. 8 is a schematic view that is illustrative of large number of memory cells and associated wiring within one sector region of FIG. 7B.
Figure 9:
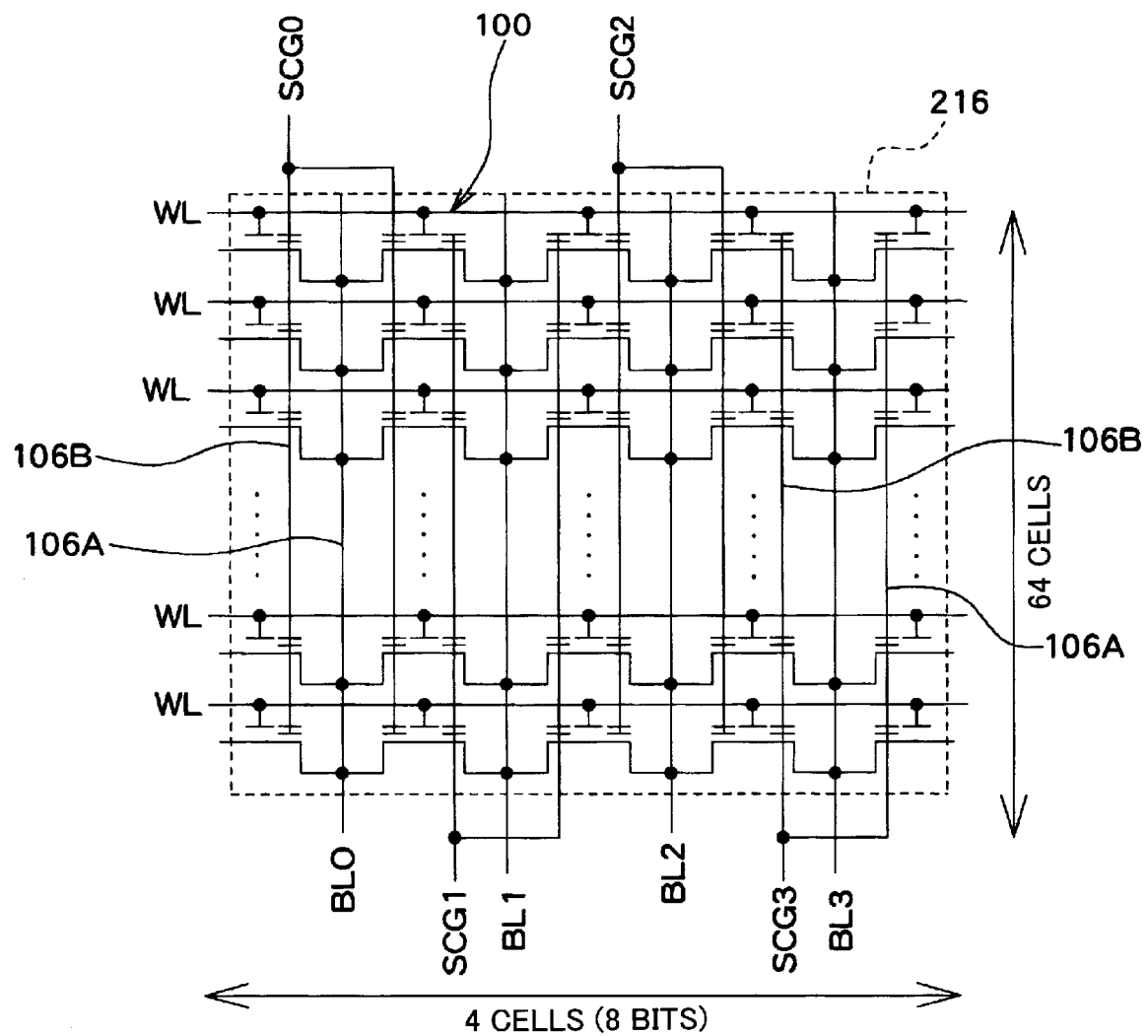
FIG. 9 is a circuit diagram showing details of the memory cells of FIG. 8.

Details of the sector region 0 of FIG. 7A are shown in FIG. 8. Small memory blocks 216 shown in FIG. 8 are arranged in such a manner that 64 are disposed in the column direction of the memory cell 100 and 4 are disposed in the row direction thereof, as shown in FIG. 9. Each small memory block 216 is connected to four sub-control gate lines SCG0 to SCG3 (which are metal wiring layers in a first layer, by way of example), four bits line BL0 to BL3 (which are data input/output lines), and 64 word lines WL.

In this case, the even-numbered control gate lines SCG0 and SCG2 are connected in common to the second control gate 106B of each of the plurality of memory cells in the even-numbered columns (0th column or second column) and to the first control gate 106A of each of the plurality of memory cells in the odd-numbered columns (first column or third column). In a similar manner, the odd-numbered sub-control gate lines SCG1 and SCG3 are connected in common to the second control gate 106B of each of the plurality of memory cells in the odd-numbered columns (first column or third column) and to the first control gate 106A of each of the plurality of memory cells in the even-numbered columns (second column or fourth column).

As shown in FIG. 8, 64 of the small memory blocks 216 are disposed in the column direction within each memory block 214 and 16 of the memory blocks 214 are disposed in the row direction in correspondence with the 16 lines I/O0 to I/O15 for 16-bit input/output.

The 16 control gate lines SCG0 of the 16 small memory blocks 216 disposed in the row direction are connected in common to metal wiring M0 of a second layer that extends in the row direction, by way of example. Similarly, the 16 sub-control gate lines SCG1 are connected to metal wiring M1, the 16 sub-control gate lines SCG2 are connected to metal wiring M2, and the 16 sub-control gate lines SCG3 are connected to metal wiring M3.

A CG driver 300 is provided as a control gate drive section for this sector region 0. Four main control gate lines MCG0 to MCG3 are provided extending in the column direction from the CG driver 300, where these could be formed from metal wiring in a third layer, by way of example.

Figure 10:
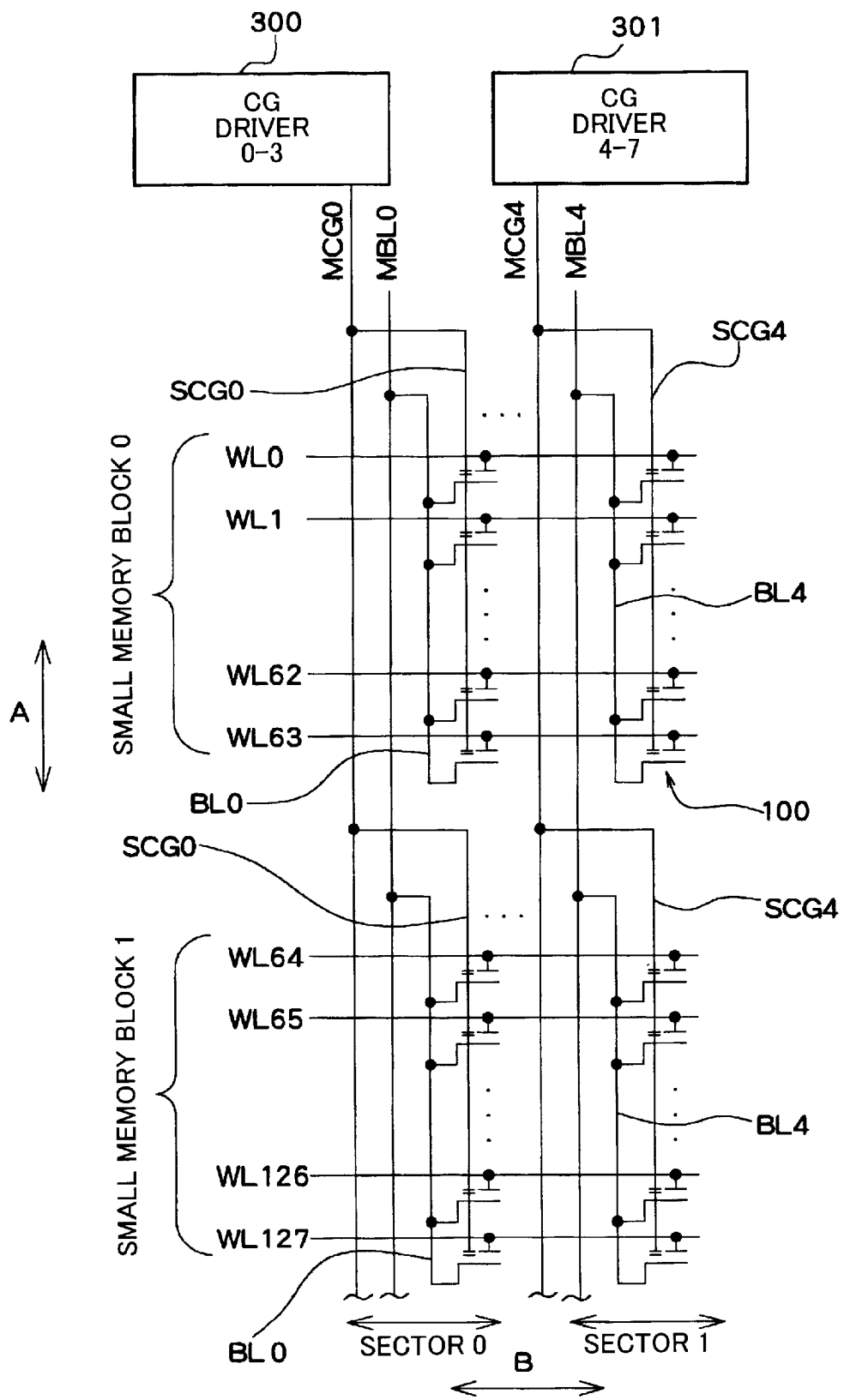
FIG. 10 is a circuit diagram showing the relationship between adjacent sector regions.

The relationship between the sector region 0 and the adjacent sector region 1 is shown in FIG. 10. The sector region 0 and the sector region 1 both use the word line WL, but a main control gate line MCG and a main bit line MBL are provided independently therefor. The CG driver 300 corresponding to the sector region 0 and the CG driver 301 corresponding to the sector region 1 are shown specifically in FIG. 10, illustrating the way in which a CG driver is provided independently for each sector region.

Taking the sector region 0 as an example, the plurality of sub-control gate lines SCG0 provided for each of the small memory blocks 216 are connected in common to a main control gate line MCG0. No gate circuit is disposed along the path from this main control gate line MCG0 to each sub-control gate line SCG0.

Similarly, a plurality of bit lines BL0 (impurity layers) disposed for each of the small memory blocks 216 are connected in common to a main bit line MBL0 that is metal wiring. No gate circuit is disposed along the path from this main bit line MBL0 to each bit line BL0. The sector regions other than the sector region 0 are arranged in a similar manner.

Operation

The potentials that are set for the control gate lines CG, the bit lines BL, and the word lines WL during data erasure and programming of the non-volatile semiconductor memory device of this embodiment are listed in Table 1 below.

TABLE 1

| | Selected Cell | | | Non-Selected Cell (in Selected Sector) | | | Non-Selected Cell (in Non-Selected Sector) | | |
|---|---|---|---|---|---|---|---|---|---|
| | CG | BL | WL | CG | BL | WL | CG | BL | WL |
| Erasure | −5V | 5V | 1.8V | — | — | — | 0V | 0V | 1.8V |
| Program | 5V | 5V | 1V | 5V | 5V | 0V | 0V | 0V | 0V or 1V |

As shown in Table 1, all of the cells in the sector region o (selected sector) are selected during data erasure and 1.8 V is supplied to the 4096 word lines WL. The first high potential for erasure (for example, −5 V) is supplied by the CG driver 300 to the four main control gate lines MCG0 to MCG3, so that the first high potential for erasure can be supplied universally to the control gates 106A and 106B of all of the memory cells within the sector region 0 (selected sector). During this time, the second high potential for erasure (for example, 5 V) is supplied to all of the bit lines BL within the sector region 0, but the method of this supply will be described later. This enables erasure of the data of all the memory cells within the selected sector region 0.

During this time, 1.8 V is supplied to all of the 4096 word lines WL in the non-selected sector regions, such as the sector region 1, but since 0 V can be supplied by the control gates CG and bit lines BL thereof independently of the sector region 0, data erasure does not occur in the non-selected sectors.

The description now turns to the programming operation. Data programming is done 16 bits at a time to the single MONOS memory cells corresponding to the 16 I/O lines with in the selected sector region 0. For that reason, 1 V is supplied to one of the word lines WL connected to the selected cells within the sector region 0, and the other 4095 word lines WL are set to 0 V. In addition, 5 V is supplied to the two control gate lines CG corresponding to CG[i] and CG[i+1] of FIG. 5 in the 16 small memory blocks 216 of the sector region 0, and the other control gate lines CG are set to 0 V. Furthermore, 5 V is supplied to the one bit line BL corresponding to the bit line BL[i+1] of FIG. 5 in the memory blocks 214 corresponding to the I/O0 to I/O15 lines within the sector region 0, and the other bit lines BL are set to 0 V. This programs data into each MONOS memory cell of the memory blocks 214 corresponding to the I/O lines within the sector region 0.

During this time, the word lines WL in the non-selected cells within the selected sector region 0 are set to 0 V, but a high potential is applied to both the control gate lines CG and the bit lines BL thereof, as shown in Table 1.

In contrast, 0 V is applied to the control gate lines CG and the bit lines BL of the non-selected cells within the sector regions that are not selected, as shown in Table 1. This ensures that there is no disturbance of non-selected cells within the non-selected sector regions, which would otherwise be caused by the application of the same high potential as that used during programming.

Although a high potential is applied to the non-selected cells within the selected sector region 0, this high potential is only applied during programming of the sector region 0. The frequency with which high potentials are applied is greatly reduced in comparison with a configuration in which a high potential is applied to non-selected cells in the other sector regions whenever programming is executed in one of the sector regions, making it possible to prevent the occurrence of disturbance.

Comparative Example

Figure 11:
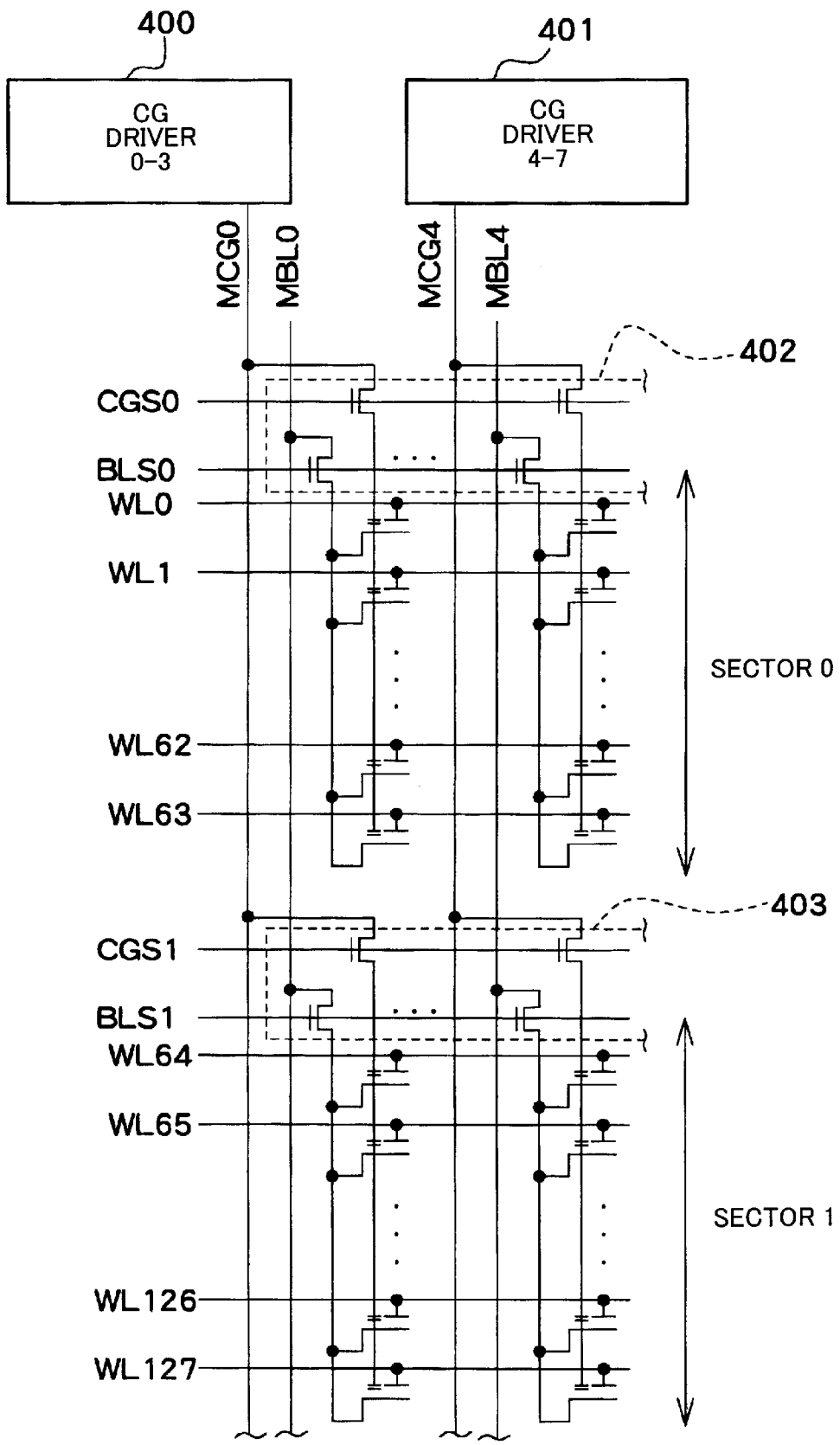
FIG. 11 is a circuit diagram showing the configuration of a comparative example with respect to FIG. 10.

The configuration of a comparative example is shown in FIG. 11. With this comparative example, the memory cell array region is divided in the column direction and has a plurality of sector regions 0, 1, ... arranged longitudinally in the column direction. In this comparative example, CG drivers 400 and 401 are not provided to correspond to sector regions 0 and 1, respectively, but are used in common by the sector regions 0 and 1.

In this case, a select gate region 402 is provided to correspond to the sector region 0 and a select gate region 403 is provided to correspond to the sector region 1, as shown in FIG. 11. Groups of n-type MOS transistors that are disposed in the select gate regions 402 and 403 are designed to select whether or not a potential supplied from the CG drivers 400 and 401 is supplied to the sector regions 0 and 1, based on the potentials of select signal lines CGS0 and CGS1. In a similar manner, other groups of n-type MOS transistors that are disposed in the select gate regions 402 and 403 are designed to select the connection or non-connection of bit lines BL to the sector regions 0 and 1, based on the potentials of select signal lines BLS0 and BLS1.

The potentials of the control gate lines CG, the bit lines BL, and the word lines WL that are set during data erasure and programming of the non-volatile semiconductor memory device of the comparative example of FIG. 11 are shown in Table 2 below.

TABLE 2

| | Selected Cell | | | | | Non-Selected Cell (in Selected Sector) | | | | | Non-Selected Cell (in Non-Selected Sector) | | | | |
|---|---|---|---|---|---|---|---|---|---|---|---|---|---|---|---|
| | CG | BL | WL | CGS | BLS | CG | BL | WL | CGS | BLS | CG | BL | WL | CGS | BLS |
| Erasure | −5V | 5V | 1.8V | 0V | 6V | — | — | — | — | — | FL | FL | 1.8V | −5V | 0V |
| Program | 5V | 5V | 1V | 6V | 6V | 5V | 5V | 0V | 6V | 6V | FL | FL | 0V | 0V | 0V |

As shown in Table 2, the potentials set in this comparative example can be substantially the same as those set in this embodiment shown in Table 1, but these are achieved by the provision of the select gate regions 402 and 403. If the select gate regions 402 and 403 were not provided, high potentials would be applied during the programming of selected cells in the selected sector region 0, and also to the non-selected cells in the non-selected sector region 1. If a high potential were to be applied to non-selected cells during such programming over sector regions, a high potential would be applied to each non-selected cell during each programming operation, which could cause disturbance.

In the comparative example, it is essential to provide a select gate region for each sector region, in order to prevent the occurrence of such disturbance. However, the surface area is increased by the amount of space occupied by these select gate regions, reducing the degree of integration of the memory cells.

If n-type MOS transistors were to be used in the select gate regions 402 and 403 of this comparative example, a voltage drop would be caused thereby, making it necessary to increase the voltage by the amount of the voltage drop in the first high potential for erasure that was originally required from the CG drivers 400 and 401, which would lead to higher voltages.

The above-described embodiment of the present invention makes it possible to omit the select gate region while preventing disturbance, making it possible to enable a high degree of integration of the memory cells with a low-voltage drive.

Note that select gates could be added to the bit lines BL in the embodiment of the present invention shown in FIG. 10. This makes it possible for the select gates to put the bit lines BL into a floating state in the non-selected cells within the selected sector region 0. Under those circumstances, the programming does not cause any high potential in the bit lines BL of the non-selected cells within the selected sector region 0. This makes it possible to further reduce the disturbance of data in non-selected cells. Note that there is a danger of voltage drop if a high potential is supplied to a bit line through a select gate.

One-Chip Memory Configuration

Figure 12:
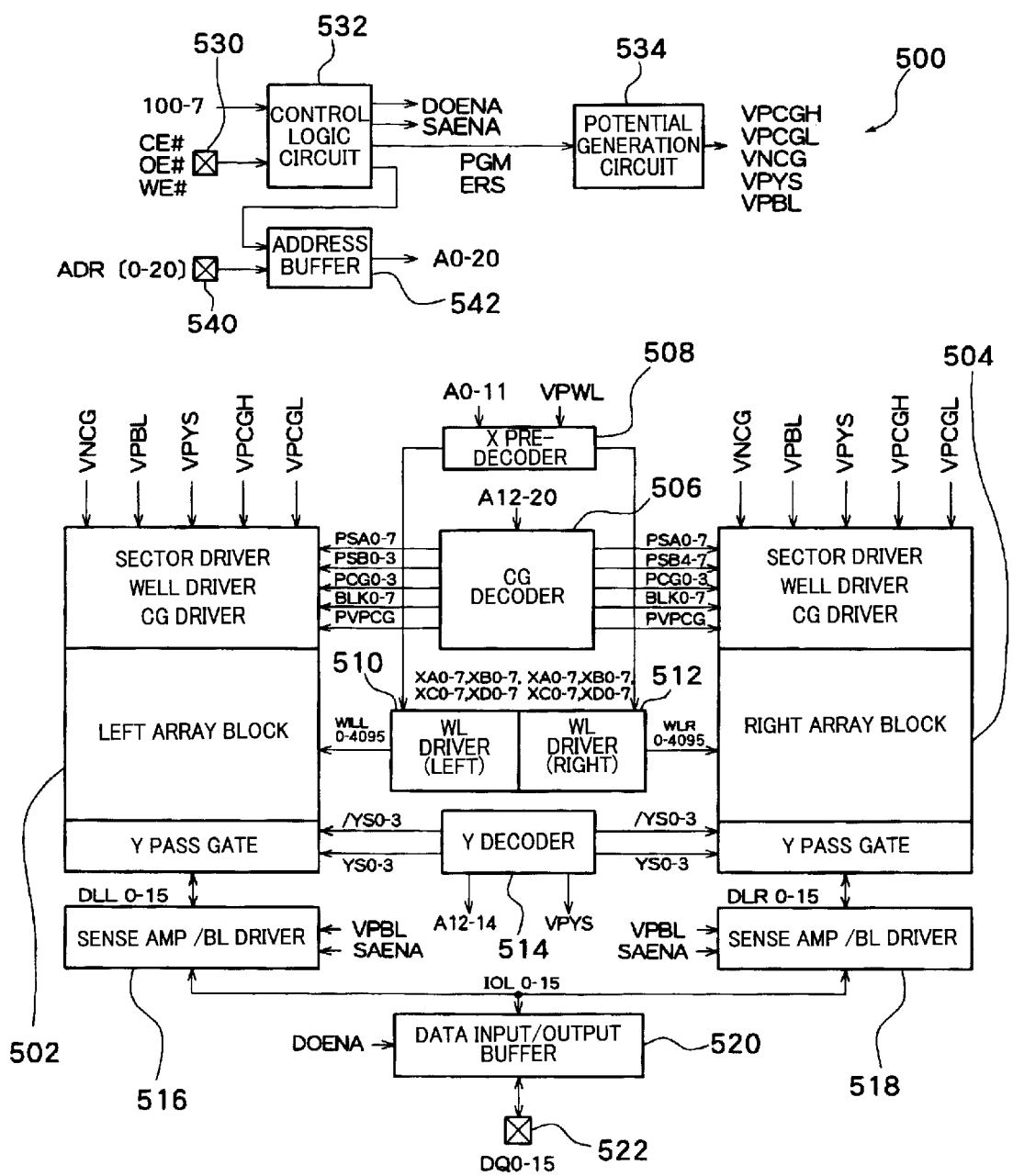
FIG. 12 is a block diagram of anon-volatile semiconductor memory device embodied on a single chip.

A schematic block diagram of the above-described non-volatile semiconductor memory device embodied as a single chip is shown in FIG. 12. In FIG. 12, a left array block 502 and a right array block 504 are provided in an IC chip 500. Each of the left and right array blocks 502 and 504 comprises the memory cell array region described with reference to FIG. 7.

Between these left and right array blocks 502 and 504 are disposed a CG decoder 506, an X pre-decoder 508, a WL driver (left) 510, a WL driver (right) 512, and an Y decoder 514.

Sense amp/BL drivers 516 and 518 are connected to the left and right memory blocks 502 and 504, respectively. The 16-bit signals IO0 to IO15 are input to or output from one of these sense amp/BL drivers 516 and 518, through a data input/output buffer 520 and an input/output terminal 522.

The IC chip 500 is further provided with a control logic circuit 532 for generating control logic signals based on various enable signals that are input through a common terminal 530. Various potentials to be supplied to lines such as the control gate lines CG and bit lines BL are generated by a potential generation circuit 534, based on the output from the control logic circuit 532.

An internal address signal A0-20 is generated by an address buffer 542, based on an address signal ADR[0-20] that is input from the outside through an address terminal 640. The bits of this internal address signal A0-20 are defined in Table 3.

TABLE 3

| Address | Group | Function |
|---|---|---|
| A[20:15] | Sector | Choose 1 of 64 |
| A[14:12] | Row | Choose 1 of 8 |
| A[11:0] | Column | Choose 1 of 4096 |

As shown in Table 3, the high-order six bits A[20:15] of the internal address signal are used for selecting one of the sector region 0 to 63 of FIG. 7A. The intermediate three bits A[14:12] of the internal address signal are used for selecting one of eight bits, from among one group of memory cells MC shown in FIG. 9. The low-order 12 bits A[11:0] of the internal address signal are used for selecting one of the 4096 word lines WL.

Figure 13:
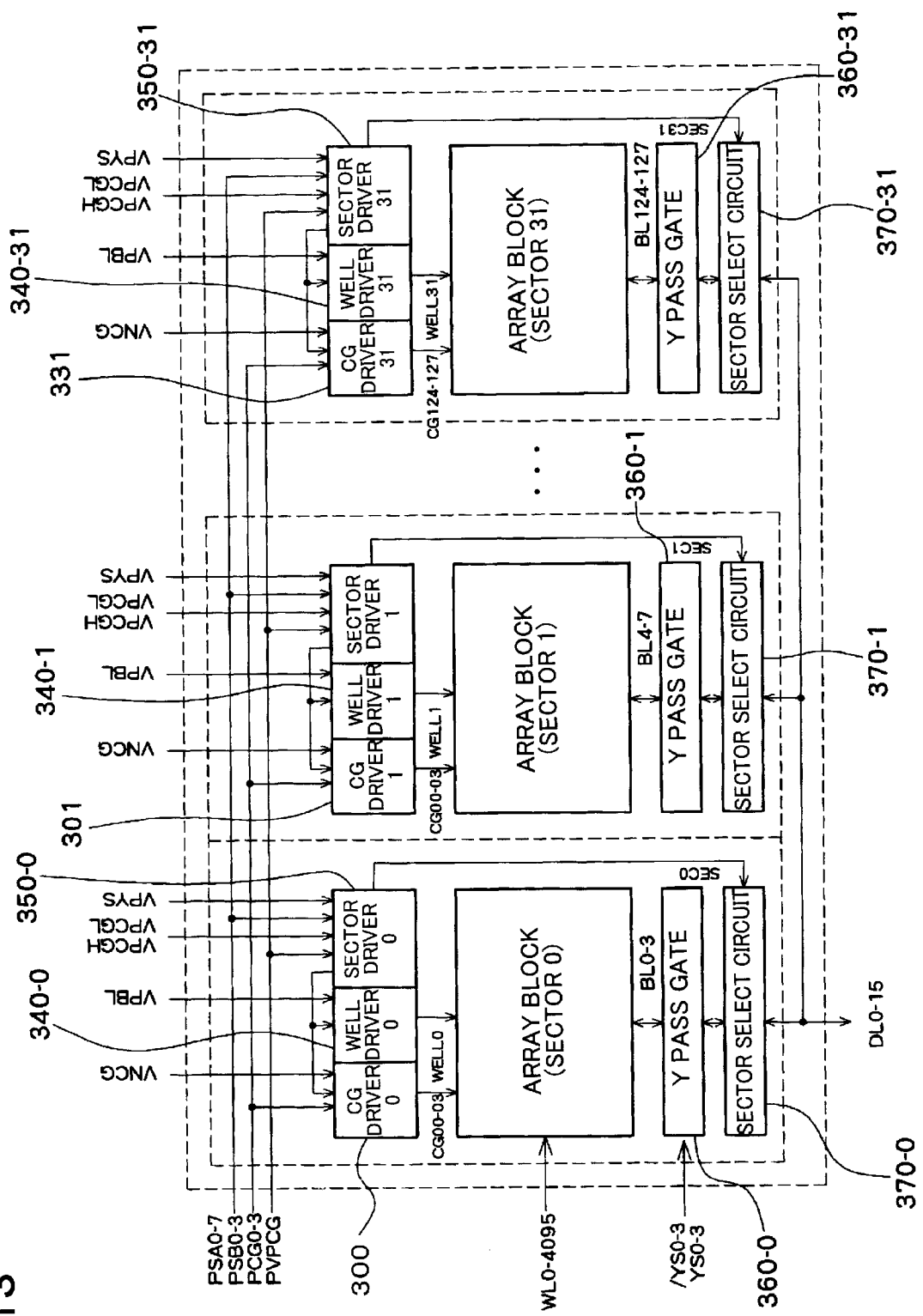
FIG. 13 is a block diagram showing details of the left memory block shown in FIG. 12.

Details of the left memory block 502 of FIG. 12 are shown in FIG. 13. This memory block 502 is divided into 32 sector regions 0 to 31 in a similar manner to that of FIG. 7A, and each of those sector regions 0 to 31 is divided into memory blocks corresponding to 16 I/O lines in a similar manner to that of FIG. 7B.

As shown in FIG. 13, CG drivers 300 to 331 are provided in a one-to-one manner for the 32 sector regions. The CG driver 300 corresponding to the sector region 0 is similar to that of FIG. 8 and supplies a control gate potential directly to each memory cell within the sector region 0. The other CG drivers 301 to 331 have similar functions.

In FIG. 13, well drivers 340-0 to 340-31 that are bit line drive sections for erasure are provided in a one-to-one manner for the 32 sector regions 0 to 31. The well driver 340-0 supplies the second high potential for erasure to the p-type well within the sector region 0, by way of example, to set the second high potential for erasure. The other well drivers 340-1 to 340-31 have similar functions.

Sector decoders 350-0 to 350-31 are also provided in a one-to-one manner for the 32 sector regions 0 to 31 in FIG. 13. The sector decoder 350-0 decodes a signal created by the high-order 6 bits A[20:15] of the internal address signal. If the sector region 0 is selected, the sector decoder 350-0 drives the CG driver 300 and the well driver 340-0, to ensure that the necessary potential is supplied to the control gate lines CG and bit lines BL.

Y pass circuits 360-0 to 360-31 and sector select circuits 370-0 to 370-31 are also provided in a one-to-one manner for the 32 sector regions 0 to 31 in FIG. 13. The Y pass circuits 360-0 to 360-31 select bit lines BL0 to BL3 that are connected to the 16 I/O lines, based on signals from the Y decoder 514 of FIG. 12. The sector select circuits 370-0 to 370-31 connect and disconnect the sense amp/BL driver 516 shown in FIG. 12, based on select signals SEC0 to SEC31 from the corresponding sector decoders 360-0 to 360-31.

Note that the present invention is not limited to the embodiment described above and thus many modifications are possible within the scope of the invention laid out herein.

For instance, the structure of the non-volatile memory elements 108A and 108B is not limited to the MONOS structure. It is also possible to apply the present invention to a non-volatile semiconductor memory device using various other types of memory cell that trap charges in two independent locations by one word gate 104 and the first and second control gates 106A and 106B.

What is claimed is:

1. A non-volatile semiconductor memory device comprising:
   a memory cell array region in which are disposed a plurality of memory cells in both a column direction and a row direction, each of the memory cells having first and second non-volatile memory elements that are controlled by one word gate and first and second control gates; and
   a control gate drive section which drives the first and second control gates of the memory cells within the memory cell array region,
   wherein the memory cell array region is divided in the row direction into a plurality of sector regions,
   wherein the control gate drive section has a plurality of control gate drivers each of which corresponds to one of the sector regions, and each of the control gate drivers is capable of setting a potential for the first and second control gates within the corresponding sector region, independently of other sector regions, wherein k main control gate lines are connected to each of the control gate drivers each of which corresponds to one of the sector regions, wherein memory blocks corresponding to I/O lines formed by a group of the memory cells connected to k sub-control gate lines are arranged in the row direction in each of the sector regions, and wherein one of the k main control gate lines is connected to the corresponding one of the k sub-control gate lines.

2. The non-volatile semiconductor memory device as defined in claim 1, wherein when data is erased, one of the control gate drivers is selected and supplies a first high potential for erasure to all of the first and second control gates within the corresponding sector region, to erase data in a batch in each of the plurality of sector regions.

3. The non-volatile semiconductor memory device as defined in claim 2, wherein a plurality of control gate lines are formed to extend in the column direction in each of the sector regions; and wherein the control gate drive section is connected directly to the control gate lines disposed in each of the sector regions, with no intervening gate circuit.

4. The non-volatile semiconductor memory device as defined in claim 3, wherein the control gate lines includes:
a plurality of main control gate lines connected directly to the control gate drive section; and
a plurality of sub-control gate lines that connect the main control gate lines to the first and second control gates of the memory cells.

5. The non-volatile semiconductor memory device as defined in claim 4, wherein an even-numbered main control gate line in each of the sector regions is connected to one of the sub-control gate lines to which the second control gates of the memory cells in an even-numbered column and the first control gates of the memory cells in an odd-numbered column are commonly connected; and wherein an odd-numbered main control gate line in each of the sector regions is connected to another one of the sub-control gate lines to which the second control gates of the memory cells in the odd-numbered column and the first control gates of the memory cells in the even-numbered column are commonly connected.

6. The non-volatile semiconductor memory device as defined in claim 5, wherein a plurality of wires are provided extending in the row direction, and each of the wires connects one of the k main control gate lines to the corresponding one of the k sub-control gate lines.

7. The non-volatile semiconductor memory device as defined in claim 6, wherein when the number of the memory cells arranged in the row direction in each of the memory blocks is 4, k is set to be 4.

8. The non-volatile semiconductor memory device as defined in claim 1, wherein each of the sector regions further includes:
a plurality of bit lines extending in the column direction; and
a first bit line drive section which drives the bit lines at least during the programming and reading of data.

9. The non-volatile semiconductor memory device as defined in claim 8, further comprising:

a second bit line drive section for erasure which supplies a second high potential for erasure to the bit lines in one of the sector regions in which data erasure is performed.

10. The non-volatile semiconductor memory device as defined in claim 8, wherein the bit lines are formed of impurity layers.

11. The non-volatile semiconductor memory device as defined in claim 10, wherein each of the sector regions is formed in a well region separated from the other sector regions, and a well drive section for erasure which supplies a second high potential for erasure to the well region is provided.

12. The non-volatile semiconductor memory device as defined in claim 10, further comprising:

a plurality of main bit lines connected respectively to the bit lines formed of the impurity layers, wherein no intervening gate circuit is provided within paths from the main bit lines to the corresponding bit lines.

13. The non-volatile semiconductor memory device as defined in claim 1, wherein the memory cell array region includes a plurality of word lines extending in the row direction, and each of the word lines is commonly connected to the word gates of the memory cells arranged in a row; and wherein a word line drive section which drives the word lines is provided at one end of the memory cell array region in the row direction.

14. The non-volatile semiconductor memory device as defined in claim 1, wherein each of the first and second non-volatile memory elements has an ONO film formed of an oxide film (O), a nitride film (N), and an oxide film (O) as a charge-trapping site.

* * * * *